US006222254B1

United States Patent
Liang et al.

(10) Patent No.: US 6,222,254 B1
(45) Date of Patent: *Apr. 24, 2001

(54) THERMAL CONDUCTING TRENCH IN A SEMICONDUCTOR STRUCTURE AND METHOD FOR FORMING THE SAME

(75) Inventors: Chunlin Liang, San Jose; Brian S. Doyle, Cupertino, both of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/829,860

(22) Filed: Mar. 31, 1997

(51) Int. Cl.$^7$ ............... H01L 29/72; H01L 29/30
(52) U.S. Cl. .............. 257/622; 257/401; 257/399; 257/408; 257/9; 257/327
(58) Field of Search ............... 257/622, 399, 257/714, 280, 327, 347, 733, 9, 300–305, 296, 330–334, 401, 408

(56) References Cited

U.S. PATENT DOCUMENTS

| | | | |
|---|---|---|---|
| 4,646,118 | * 2/1987 | Takemae | 257/304 |
| 4,751,558 | * 6/1988 | Kenney | 257/302 |
| 4,763,181 | * 8/1988 | Tasch, Jr. | 257/300 |
| 4,811,067 | * 3/1989 | Fitzgerald et al. | 257/301 |
| 4,894,696 | * 1/1990 | Takeda et al. | 257/303 |
| 5,001,525 | * 3/1991 | Kenney | 257/302 |
| 5,026,658 | * 6/1991 | Fuse et al. | 438/248 |
| 5,071,782 | * 12/1991 | Mori | 438/259 |
| 5,187,566 | * 2/1993 | Yoshikawa et al. | 257/301 |
| 5,250,458 | * 10/1993 | Tsukamoto et al. | 257/303 |
| 5,309,008 | * 5/1994 | Watanabe | 257/304 |
| 5,313,094 | * 5/1994 | Beyer et al. | 257/622 |
| 5,369,049 | * 11/1994 | Acocella et al. | 257/301 |
| 5,384,474 | * 1/1995 | Park et al. | 257/305 |
| 5,386,131 | * 1/1995 | Sato | 257/300 |
| 5,387,534 | * 2/1995 | Prall . | |
| 5,410,503 | * 4/1995 | Anzai | 365/149 |
| 5,424,569 | * 6/1995 | Prall | 257/324 |
| 5,432,365 | * 7/1995 | Chin et al. | 257/301 |
| 5,508,541 | * 4/1996 | Hieda et al. | 257/304 |
| 5,508,542 | * 4/1996 | Geiss et al. | 257/301 |
| 5,512,767 | * 4/1996 | Noble, Jr. | 257/305 |
| 5,521,115 | * 5/1996 | Bork et al. . | |
| 5,559,048 | * 9/1996 | Inoue | 438/257 |
| 5,594,682 | * 1/1997 | Lu et al. | 257/301 |
| 5,612,562 | * 3/1997 | Baliga | 257/475 |
| 5,650,639 | * 7/1997 | Schrantz et al. | 257/77 |
| 5,662,768 | * 9/1997 | Rostoker | 257/301 |
| 5,672,889 | * 9/1997 | Brown | 257/77 |
| 5,675,176 | * 10/1997 | Ushiku et al. | 257/617 |
| 5,683,939 | * 11/1997 | Schrantz et al. | 437/195 |
| 5,701,022 | * 12/1997 | Kellner et al. | 257/300 |
| 5,731,609 | * 3/1998 | Hamomoto et al. | 257/302 |
| 5,736,760 | * 4/1998 | Hieda et al. | 257/301 |
| 5,739,567 | * 4/1998 | Wong | 257/316 |

(List continued on next page.)

Primary Examiner—Alexander O. Williams
(74) Attorney, Agent, or Firm—Blakely, Sokoloff, Taylor & Zafman LLP

(57) ABSTRACT

The invention relates to a method of forming a trench filled with a thermally conducting material in a semiconductor substrate. In one embodiment, the method includes filling a portion of the trench with a thermally conducting material and patterning a contact to the thermally conducting material. The invention also relates to a semiconductor device. In one embodiment, the semiconductor device has a trench defining a cell region, wherein a portion of the trench includes a thermally conducting material, and a contact to the thermally conducting material. The invention further relates to a semiconductor device and a method of forming a semiconductor device with an interlayer dielectric that is a thermally conducting material.

12 Claims, 8 Drawing Sheets

U.S. PATENT DOCUMENTS

| | | | |
|---|---|---|---|
| 5,767,578 | * | 6/1998 | Chong et al. .......................... 257/717 |
| 5,798,545 | * | 8/1998 | Iwasa et al. ........................... 257/301 |
| 5,801,423 | * | 9/1998 | Manning ............................... 257/374 |
| 5,909,039 | * | 6/1999 | Bakewski et al. .................... 257/137 |
| 5,945,707 | * | 8/1999 | Bronner et al. ....................... 257/330 |
| 5,969,395 | * | 10/1999 | Lee ....................................... 257/408 |
| 5,970,339 | * | 10/1999 | Choi ..................................... 438/243 |

* cited by examiner

THERMAL CONDUCTING TRENCH IN A SEMICONDUCTOR STRUCTURE AND METHOD FOR FORMING THE SAME

BACKGROUND OF THE INVENTION

1. Field of the Invention

The invention relates generally to the field of semiconductor devices and, more particularly, to dissipating heat generated by the operation of such devices.

2. Description of Related Art

One goal of complementary metal oxide semiconductors (CMOS) in very large scale integration (VLSI) and ultra large scale integration (ULSI) is to increase chip density and operation speed. However, with increased chip density and operation speed, CMOS power consumption is also increased dramatically. It is expected that the power consumption of a high performance microprocessor will increase from several watts currently to approximately several hundred watts in the near future. The heat generated from this power consumption will raise chip temperature dramatically and degrade circuit performance and reliability. Therefore, reducing chip operation temperature is of great importance for current as well as future VLSI and ULSI technology.

To date, reduction of chip temperature is accomplished in two ways: 1) Lowering the power consumption, and 2) improving heat dissipation to the ambient environment. The first method is the preferred approach. A lowering of the power consumption is usually accomplished by scaling down the power supply voltage. The power consumption of integrated circuit chips has decreased from 5.0 volts several years ago to today's approximately 1.5 volts. However, lowering of the power supply voltage may impact negatively on the performance of the device. Because of the non-scaleability of the build-in voltage of a silicon junction, there is little room for further reduction of the power supply voltage below 1.0 volts if traditional technology is used. Thus, for high performance VLSI and ULSI circuits, further lowering of the power supply voltage may not be the most effective approach.

As indicated previously, the second approach to the reduction of chip temperature is through improved heat dissipation to the ambient environment. The heat dissipates mainly through the silicon substrate into a metal heat sink inside the package and through a metal interconnect system. This approach typically employs a heat sink/ground plan in physical contact with the silicon substrate. Some modern technologies, however, have eliminated the heat sink/ground plan in physical contact with the silicon substrate. One example is flip-chip technology wherein the chip is inverted so that the interconnect system lies on the underside of the chip rather than on the exposed top surface. These technologies encapsulate the silicon chip inside a package with epoxy material thus eliminating the contact between the silicon substrate and a heat sink. Instead, the metal interconnect system becomes the dominant heat dissipation path.

Heat dissipation through the interconnect system may be improved by increasing the total physical contact area to a heat source. A large effective physical contact area will reduce the thermal resistivity proportionally. In a typical chip design, the primary effective thermal contact to the transistor is provided by the diffusion or source/drain contact. The total source and drain physical contact area is, however, limited to a small percentage of the total chip size because other structures, such as an active channel, isolation, metal interconnect, and separation space, consume a much larger area of a given chip. Thus, the current design of the thermal contact area to the transistor (i.e., the area available to effectively dissipate heat generated by the transistor) is insufficient to dissipate the heat generated by the power consumption anticipated for future CMOS technology.

SUMMARY OF THE INVENTION

A method of forming a trench filled with a thermally conducting material in a semiconductor substrate is disclosed. In one embodiment, the method includes filling a portion of the trench with a thermally conducting material and patterning a contact to the thermally conducting material. A semiconductor device is also disclosed. In one embodiment, the semiconductor device has a trench defining a cell region, wherein a portion of the trench includes a thermally conducting material, and a contact to the thermally conducting material. A semiconductor device and a method of forming a semiconductor device with an interlayer dielectric that is a thermally conducting material is further disclosed.

Additional features and benefits of the invention will become apparent from the detailed description, figures, and claims set forth below.

DETAILED DESCRIPTION OF THE INVENTION

Embodiments in accordance with the present invention include a semiconductor device and a method for forming a semiconductor device having a trench with a portion of the trench filled with a thermally conducting material defining a cell or active region. Embodiments in accordance with the invention also include a semiconductor device and a method for forming a semiconductor device having a trench with a portion of the trench filled with a thermally conducting material defining a cell or active region and a contact to the thermally conducting material. Embodiments in accordance with the invention further include a semiconductor device and a method for forming a semiconductor device with an interlayer dielectric that is a thermally conducting material. Embodiments of the device and process for making the device allow for improved heat dissipation across a chip.

In one embodiment, a thermal conducting trench filled with a thermally conducting material is embedded in the chip active layer very close to the heating source, e.g., the transistor. The thermally conducting trench may be constructed throughout the isolation region and may provide sufficient extra thermal contact area in addition to those contributed from electrical source/drain contacts, so that sufficient heat may be dissipated without adding extra space. Therefore, the thermal conducting channel filled in the active layer provides additional thermal contact area and significantly relieves the thermal heating problem with little penalty on chip size or process complexity. In another embodiment, thermally conducting material is used as a replacement for part or all of the interlayer dielectric to improve the heat dissipation in higher level structures.

In the following description, numerous specific details are set forth such as specific materials, thicknesses, processing steps, process parameters, etc., in order to provide a thorough understanding of the invention. One skilled in the art will understand that these specific details need not be employed to practice the invention.

Figure 1:
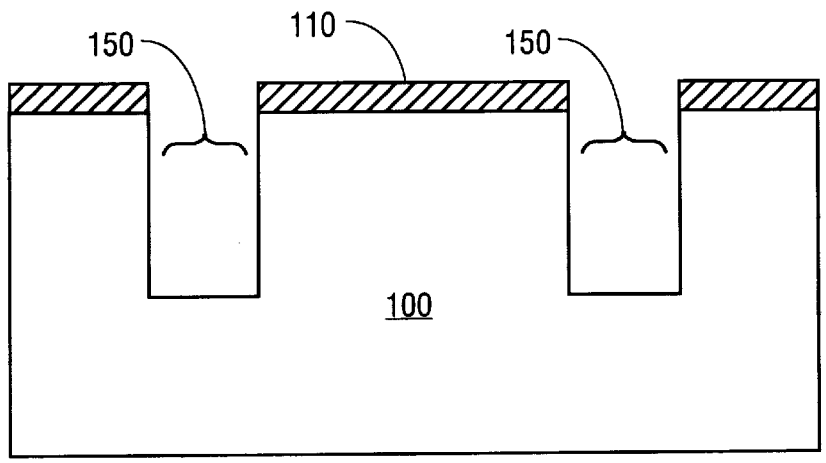
FIG. 1 is a schematic diagram of a portion of a semiconductor substrate showing a masking layer overlying the substrate and a trench formed in the substrate for an embodiment of an integrated circuit structure having a trench filled with a thermally conducting material in the semiconductor substrate in accordance with the invention.

FIGS. 1–6 illustrate schematically an embodiment of a method of forming a semiconductor structure in accordance with the invention. FIG. 1 illustrates the formation of trenches 150 in silicon substrate 100. The trenches filled with a thermally conducting material are formed using conventional trench isolation techniques. In this trench isolation process, a masking layer 110, such as for example, a silicon nitride ($Si_x N_y$) masking layer 110, is deposited over silicon substrate 100 to protect substrate 100 from a subsequent etchant and to define a trench or trench pattern. Next, the structure is exposed to a suitable etchant to form trench 150 in the silicon substrate. The etching of trench 150 may be carried out by a chlorine etch chemistry, such as for example, $BCl_3/Cl_2$, $H_2/Cl_2/SiCl_4$, and $CHCl_3/O_2/N_2$, or other suitable etch chemistry as known in the art.

Trench 150 may be used to define an active region, for example isolating $n^+$ and $p^+$ regions in CMOS circuits. The trench depth may vary, but typically is approximately uniform across the semiconductor substrate 100 and determined by the particular requirements of the structure. In CMOS technology, such trenches 150 typically range from a depth of 0.4 $\mu$m to greater than 3 $\mu$m.

Figure 2:
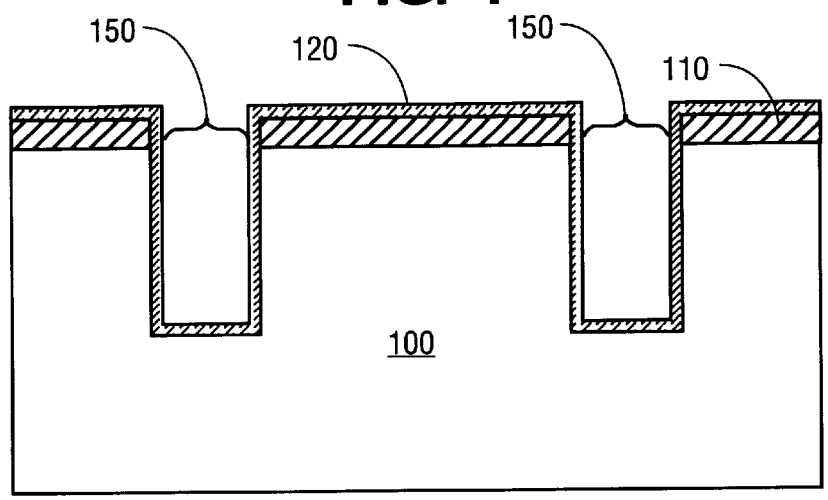
FIG. 2 is a schematic diagram of a portion of an integrated circuit structure showing a dielectric material passivating the sidewalls of the trench and overlying the masking layer for an embodiment of an integrated circuit structure having a trench filled with a thermally conducting material in the semiconductor substrate in accordance with the invention.

Next, as shown in FIG. 2, a dielectric interface layer 120 is formed over the masking layer 110 and adjacent to the sidewalls and base of the trench 150. Interface layer 120 may be deposited by conventional techniques, e.g., chemical vapor deposition of dielectric material, or may be grown, e.g., thermal $SiO_2$. Interface layer 120 seals off the exposed silicon in the trench and passivates the trench. Interface layer 120 serves as an interface between silicon substrate 100 and the thermally conducting material that will ultimately be filled in the trench. Interface layer 120 serves to prevent any trench leakage between devices isolated by the trench 150.

In some embodiments, interface layer 120 thickness may be limited. The thicker interface layer 120, the higher the thermal resistivity between silicon substrate 100 and material in the trench 150. The thermal resistivity of trench 150 is increased by a thicker interface layer 120, because the heat that is given off by an adjacent device, for example, is impeded from traveling to the thermally conducting material by interface layer 120. An interface layer 120 of $SiO_2$, for example, of 300 Å or less may be appropriate to impart the desirable properties of an interface and suitable thermal resistivity. It is to be appreciated, however, that various dielectric materials of various thicknesses may be used as an interface layer 120. Further, if channel leakage is not a concern, the interface layer 120 may be eliminated.

Figure 3:
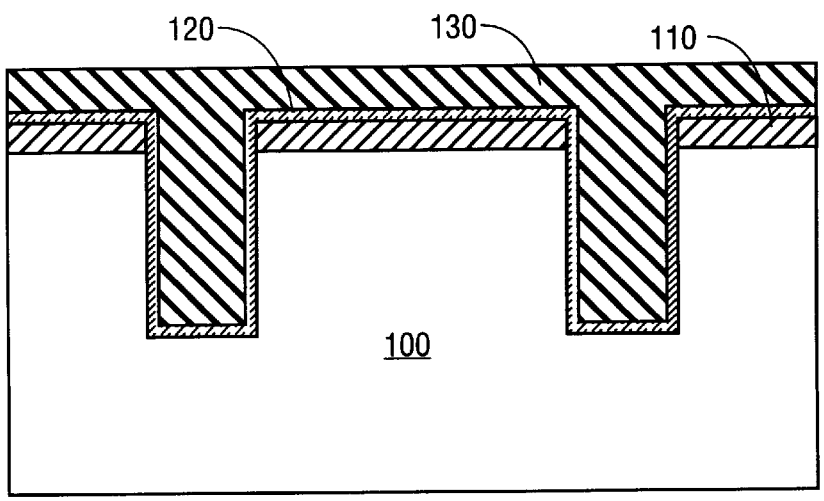
FIG. 3 is a schematic diagram of a portion of an integrated circuit structure showing a thermally conducting material overlying the passivating dielectric layer and filled in the trench for an embodiment of an integrated circuit structure having a trench filled with a thermally conducting material in the semiconductor substrate in accordance with the invention.

After interface layer 120 is formed in trench 150, FIG. 3 illustrated a thermal conducting layer 130 deposited over the substrate and into trench 150. The layer 130 should also be electrically insulating. Thermally conductive material is material that transfers heat from one point to another. In this context, a thermally conductive material is a material that transfers or conducts heat and may be distinguished, for example, by those materials that primarily insulate, like conventional semiconductor dielectrics such as $SiO_2$ or $Si_xN_y$. High thermal conductivity is a thermal conductivity greater than 0.2 W/cmK. Of course, the invention is not limited to utilizing materials that have high thermal conductivity. Thermally conductive materials suitable for use in the invention include, but are not limited to, AlN, BN, SiC, polysilicon, and chemical vapor deposited (CVD) diamond. Table I compares the thermal conductivities of ordinary dielectrics of $SiO_2$ and $Si_xN_y$ with these thermally conducting materials and copper metal.

TABLE I

| Thermal Conductivity (W/cm K): | | | | | | | |
| --- | --- | --- | --- | --- | --- | --- | --- |
| $SiO_2$ | $Si_3N_4$ | SiC | Poly Si | AlN | BN | Diamond | Cu |
| 0.014 | 0.185 | 0.38 | 1.412 | 1.8–3.2 | 3.5–4.5 | 12–23 | 2.0–5.0 |

Figure 4:
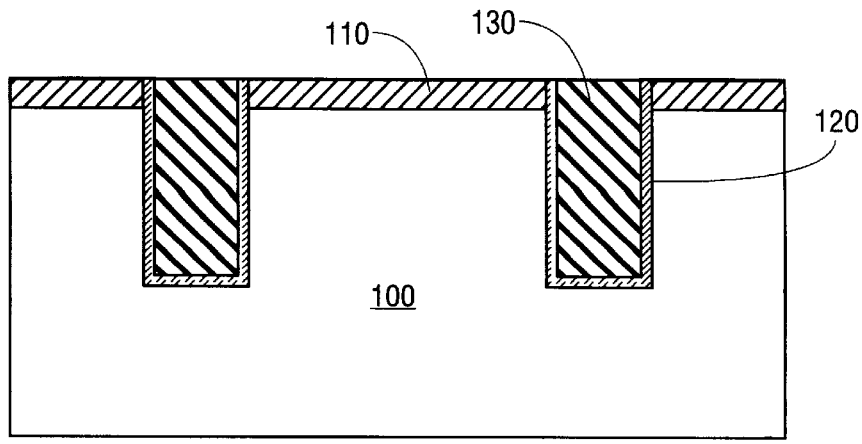
FIG. 4 is a schematic diagram of a portion of an integrated circuit structure showing the thermally conducting material filled in the trench and removed from the surface of the substrate by using the masking layer as an etch stop for an embodiment of an integrated circuit structure having a trench filled with a thermally conducting material in the semiconductor substrate in accordance with the invention.

As shown in FIG. 4, a chemical-mechanical polishing step, suitable for thermally conducting material 130, is next used to polish away thermally conducting material 130 from the substrate surface leaving thermally conducting material 130 only in trench region 150. The chemical mechanical polish is accomplished using the dielectric layer (e.g., $Si_xN_y$) 110 as an etch stop. In other words, both thermally conducting material 130 and interface layer 120 are removed from the upper surface of the substrate 100 but remain in trench 150. Though the removal of thermally conducting material 130 from the surface of the substrate is described herein as a chemical-mechanical polishing step, it is to be appreciated that excess thermally conducting material 130 may be removed by way of other techniques, such as for example, conventional etching techniques.

Figure 5:
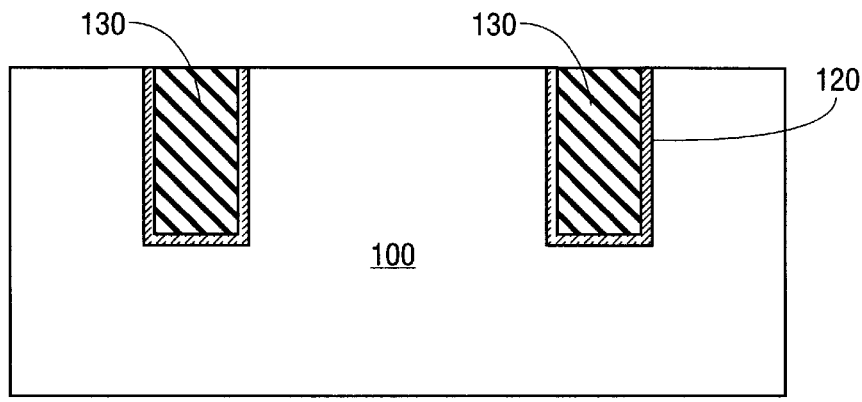
FIG. 5 is a schematic diagram of a portion of an integrated circuit structure showing the masking layer removed for an embodiment of an integrated circuit structure having a trench filled with a thermally conducting material in the semiconductor substrate in accordance with the invention.

Next, as shown in FIG. 5, the dielectric/etch stop layer 110 is removed from the substrate surface using standard dry etching techniques. For example, a $Si_xN_y$ etch stop layer is removed using, for example, a $CHF_3/O_2$ etch chemistry. The same etch stop layer may alternatively be removed by wet etching, such as for example, by hot phosphoric acid.

Figure 6:
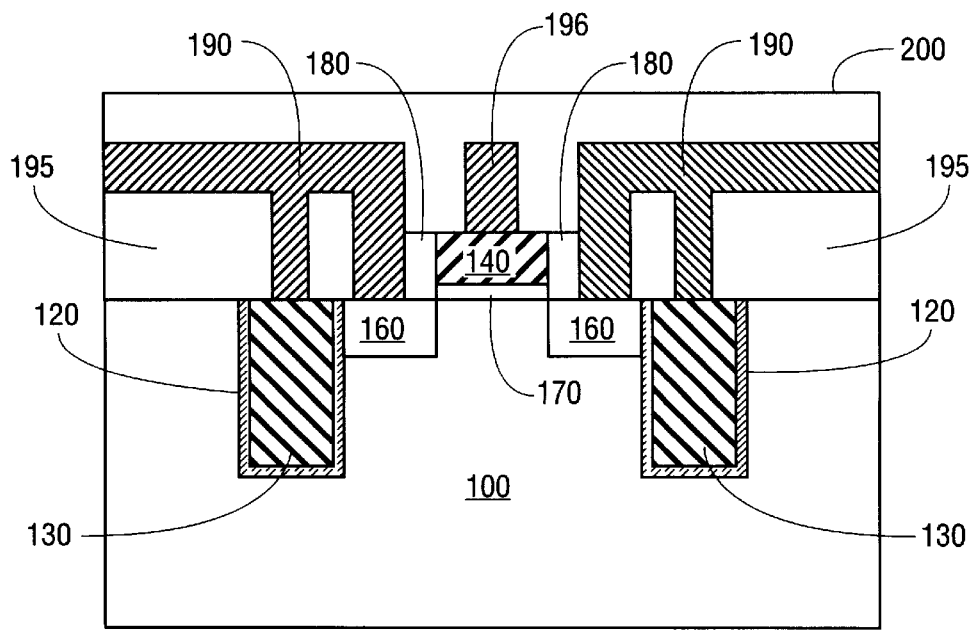
FIG. 6 is a schematic diagram of a portion of an integrated circuit structure showing a transistor structure formed adjacent to the trench and conductive interconnections to the transistor and the trench for an embodiment of an integrated circuit structure having a trench filled with a thermally conducting material in the semiconductor substrate in accordance with the invention.

With the thermally conducting trench formed, conventional fabrication processes may be used to formulate the integrated circuit structures on the substrate. A schematic side view of a portion of an integrated circuit structure is shown in FIG. 6. In FIG. 6, a transistor is formed in the cell or active region defined by trench 150 of substrate 100. The transistor consists of a gate 140 that is, for example, doped polysilicon, overlying a gate oxide 170 and adjacent to $n^+$ or $p^+$ diffusion regions 160 in substrate 100 that is of the opposite dopant of diffusion regions 160. Adjacent gate 140 are sidewall dielectric spacers 180. Sidewall spacers 180 may comprise virtually any dielectric, including a single oxide or silicon nitride ($Si_xN_y$) or several layers formed by various methods. For example, one or more layers of oxide may be deposited by plasma-enhanced chemical vapor deposition ("PECVD"), thermal CVD, atmospheric pressure CVD, and subatmospheric pressure CVD. An interlayer dielectric (ILD) material 195 is deposited and contact holes are formed to permit discrete metal contacts to diffusion regions 160 and trenches 150. Finally, FIG. 6 shows a contact to 196 to gate 140 and interlayer dielectric 195 and 200, respectively, isolating the electrical/thermal interconnect systems.

As noted above, a metal interconnect 190, that is, for example, aluminum, is deposited to the diffusion regions 160 to form an electrical interconnection between the diffusion regions of the transistor and the integrated circuit. A similar conductive interconnection is patterned to the thermally conducting material 130 in trench 150. In one embodiment, interconnect 190 is patterned to diffusion region 160 and thermally conducting material 130. In other words, electrical interconnect system 190 may be used as a thermal interconnect system for heat transfer purposes as well as electrical interconnect purposes. The thermally conducting material 130 in this embodiment should be electrically insulating to prevent shorting problems. It should, however, be appreciated, that the thermal interconnect system and the electrical interconnect system need not be the same. Instead, separate or discrete interconnect systems may be established for electrical and thermal purposes. Further, in an embodiment utilizing thermal conducting material 130 having thermal conductivities greater than 1.8 W/cmK, no contact to thermally conducting material 130 is necessary.

To form interconnect system 190 that is to be used as both an electrical interconnect system and a thermal interconnect system, a masking layer is deposited over dielectric layer 195 exposing areas that will become vias or openings to thermally conducting material 130 and diffusion regions 160. Next, the via or openings to thermally conducting material 130 and diffusion regions 160 are formed by conventional etching techniques. For example, a tetraethylorthosilicate (TEOS) $SiO_2$ dielectric layer 195 is anisotropically etched with a $CHF_3/O_2$ etch chemistry to form vias or openings to thermally conducting material 130 and diffusion regions 160. Once the vias or openings are formed to thermally conducting material 130 and diffusion regions 160, the masking layer is removed and a metal, for example aluminum, is patterned concurrently to both thermally conducting material 130 and diffusion regions 160.

The introduction of a trench filled with thermally conducting material significantly improves the thermal dissipation of the chip with little, if any, negative impact on performance in process. Thus, heat generated, for example, by a transistor device may be transferred to the thermally conducting material and then transferred away from the individual device, by transfer through the thermally conductive material itself or, in the embodiment where there is a contact to the thermally conductive material, through the contact, and, optionally, through a heat sink connected to the interconnect system.

It is generally accepted, for example, that dielectric materials with high thermal conductivity, such as would be suitable for use in the invention, generally will have a high dielectric constant which will tend to increase the intermetal capacitance and slow down a device. Because the thermally conducting material is embedded in the semiconductor substrate there is little or no negative effect on the circuit speed. Further, once the trench with the thermally conducting material is in place, the modifications to the conventional semiconductor processing steps are not significant, notably the patterning of a metal contact to the trench. However, since the electrical metal interconnect system can be used also as the thermal interconnect system as shown in FIG. 6, the process steps of patterning the metal to the trench are not significant. Further, since the optional interface dielectric layer along the sidewalls of the trench is as thin as 300 Å or less, thermal conduction between the active transistor and the thermally conducting material 130 is achieved.

Figure 7:
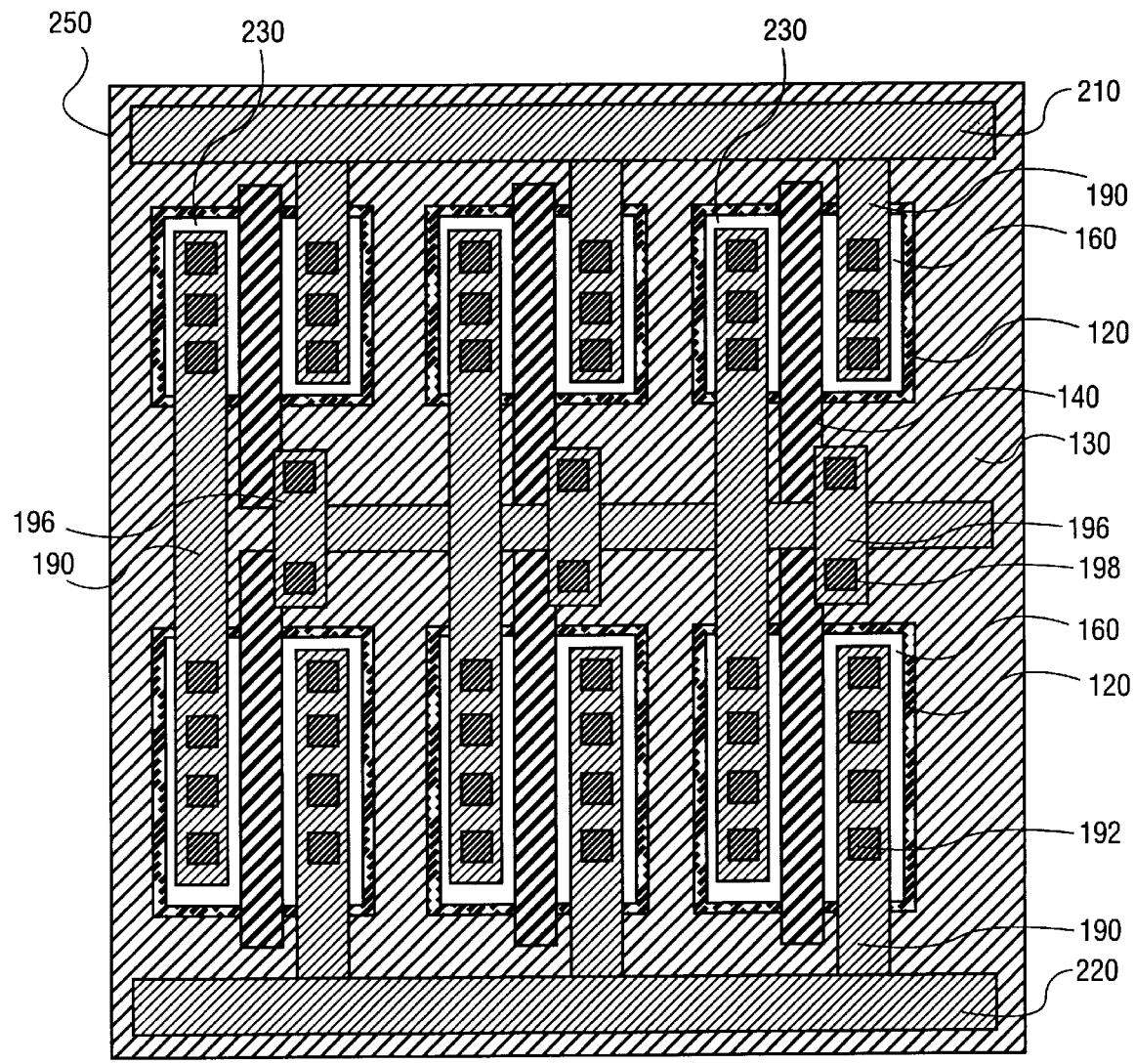
FIG. 7 is a schematic view of a portion of an integrated circuit structure showing six transistor devices and thermally conducting dielectric material filled trench/trench isolation for an embodiment of an integrated circuit structure having a trench filled with a thermally conducting material in the semiconductor substrate in accordance with the invention.

FIG. 7 is a schematic top view illustrating an embodiment of an integrated circuit structure with thermally conducting material filled trench isolation. In FIG. 7, thermally conducting material 130 forms a filled thermal conduction network across chip 250. FIG. 7 shows six transistors 230 including a gate 140 with diffusion regions 160. Each of the six transistors 230 is isolated from one another by a trench filled with a thermally conducting material 130. Metal interconnects 190 are patterned to the diffusion regions. Electrical interconnections 190 are coupled to bus lines 210 and 220, respectively (for example, $V_{CC}$ and $V_{SS}$ bus lines). A further electrical contact 196 is patterned to gate 140 of each active transistor 230.

Figure 8:
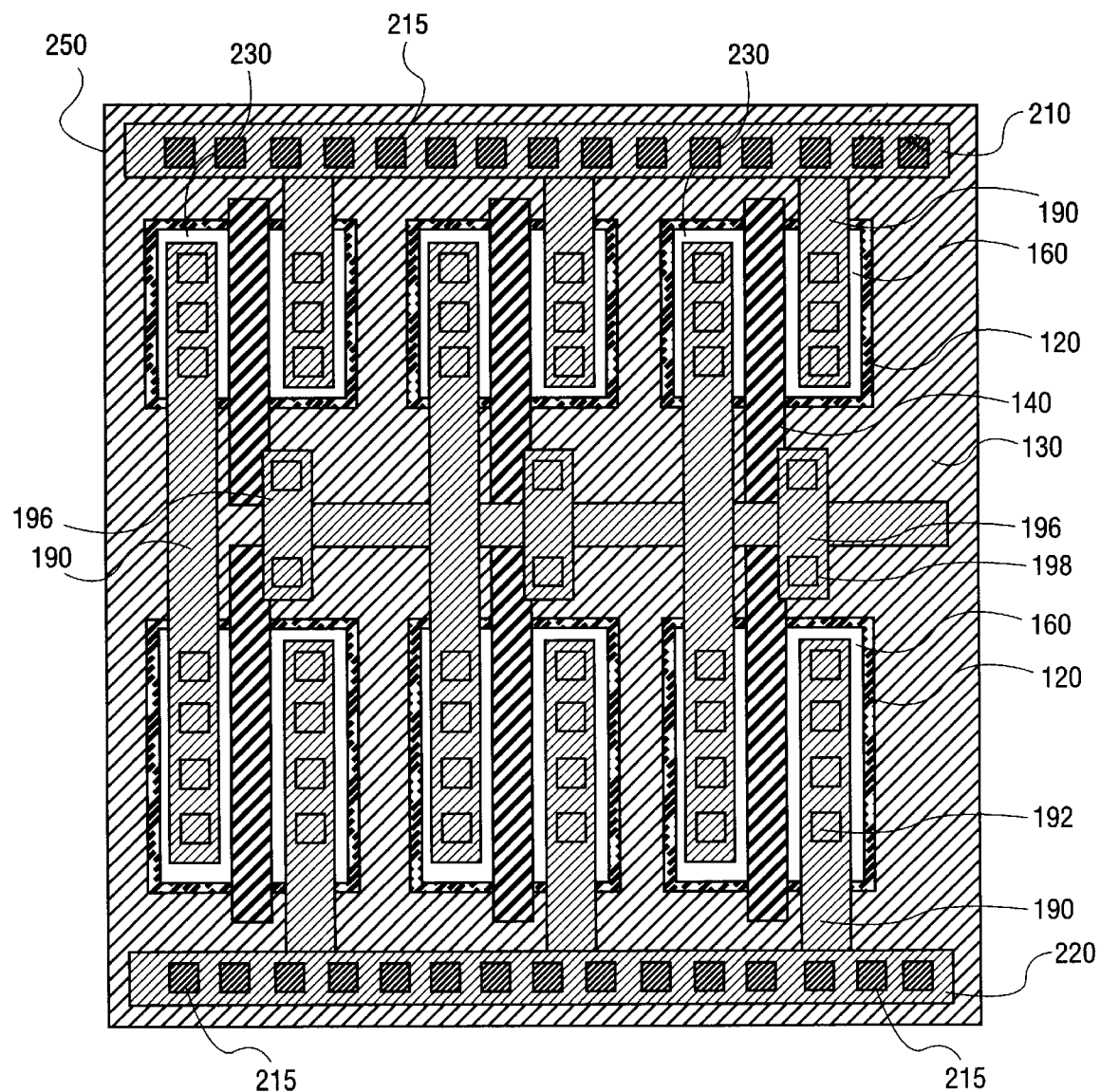
FIG. 8 is a schematic view of a portion of an integrated circuit structure showing power (e.g., $V_{CC}$ and $V_{SS}$) bus metal lines also used as the thermal connection to the thermally conducting material in the trench for an embodiment of an integrated circuit structure having a trench filled with a thermally conducting material in the semiconductor substrate in accordance with the invention.
Figure 9:
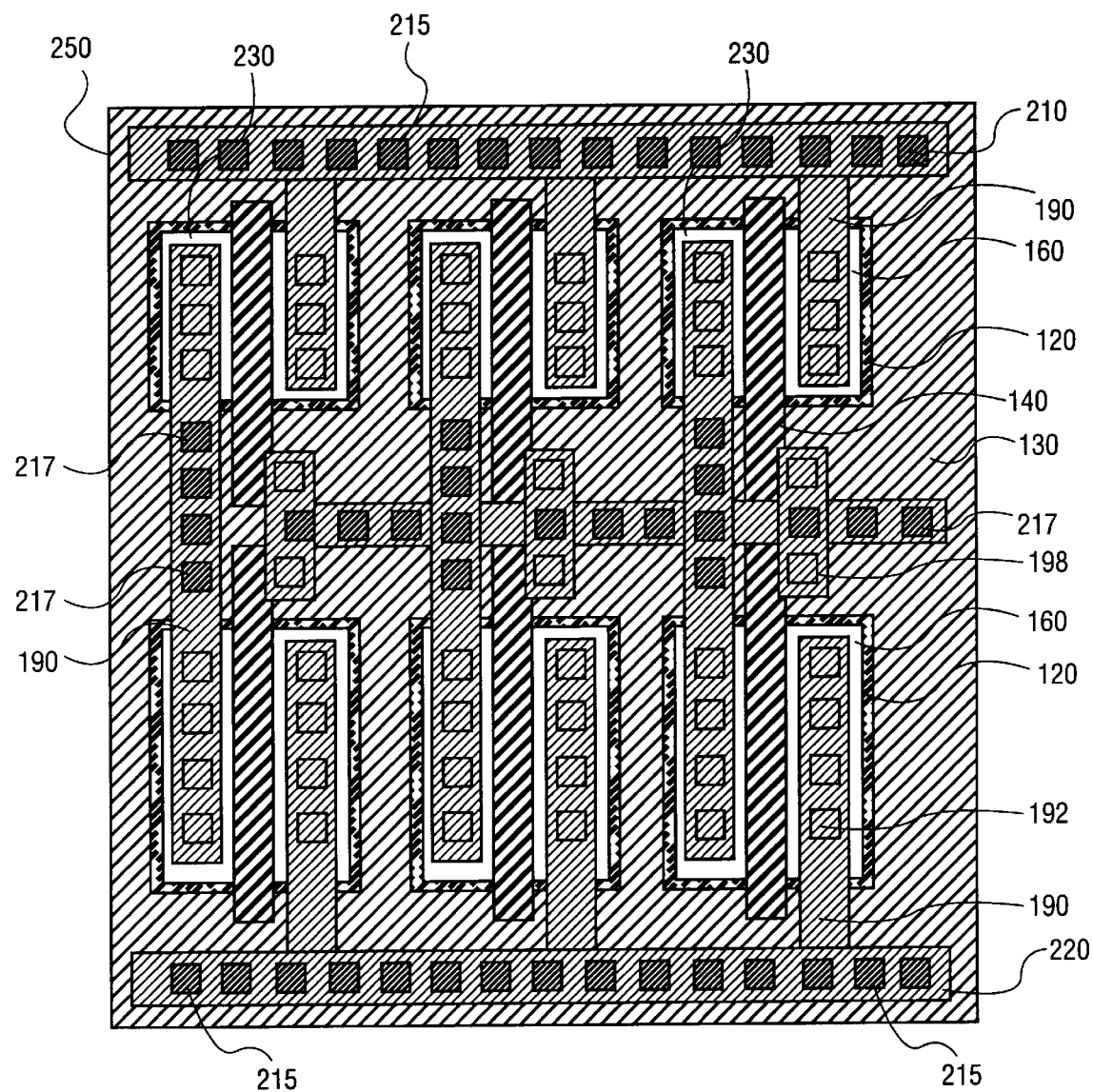
FIG. 9 is a schematic view of a portion of an integrated circuit structure showing the regular electrical metal interconnections used as thermal connections to the thermally conducting material in the trench for an embodiment of an integrated circuit structure having a trench filled with a thermally conducting material in the semiconductor substrate in accordance with the invention.

FIG. 8 is a schematic top view of a portion of an integrated circuit structure wherein the electrical interconnect system is also used for heat transfer purposes. In FIG. 8, bus lines 210 and 220, respectfully, are patterned to the thermally conducting material 130. Patterning to thermally conducting material 130 is illustrated by contacts 215 on the bus lines. In this manner, the heat conducted from the transistor 230 to the thermally conducting material 130 can be dissipated through the metal interconnect system to, for example, an external heat sink (not shown). Since thermally conducting material 130 is thermal conducting and electrically insulating, the same electrical interconnect system can be used for heat transfer purposes. The structure shown in FIG. 9 includes contacts 215 to the bus lines as well as contacts 217 to other metal interconnect of the circuit to further enhance the heat dissipation capacity of the circuit.

Compared with replacing all of the interlayer dielectric material with thermally conducting material, the approach of the previous embodiments of the invention does not raise interconnect loading capacitance significantly. Further, these embodiments do not require dedicated thermal interconnect systems or any additional chip density. These embodiments also provide more contact area between the metal interconnect and the heating source, e.g., the active transistor.

FIGS. 10–14 are schematic side views of an embodiment of a process of forming further embodiments of the invention wherein thermally conducting material replaces the interlayer dielectric material of the circuit. Because the thermally conducting material will replace interlayer dielectric material, the thermally conducting material should also be electrically insulating. The following described embodiments may be used where a small increase in interconnect coupling capacitance could be tolerated. It is to be noted that the process described herein to create a structure with interlayer thermally conducting material may or may not be used in conjunction with the thermally conducting substrate trenches described above.

Figure 10:
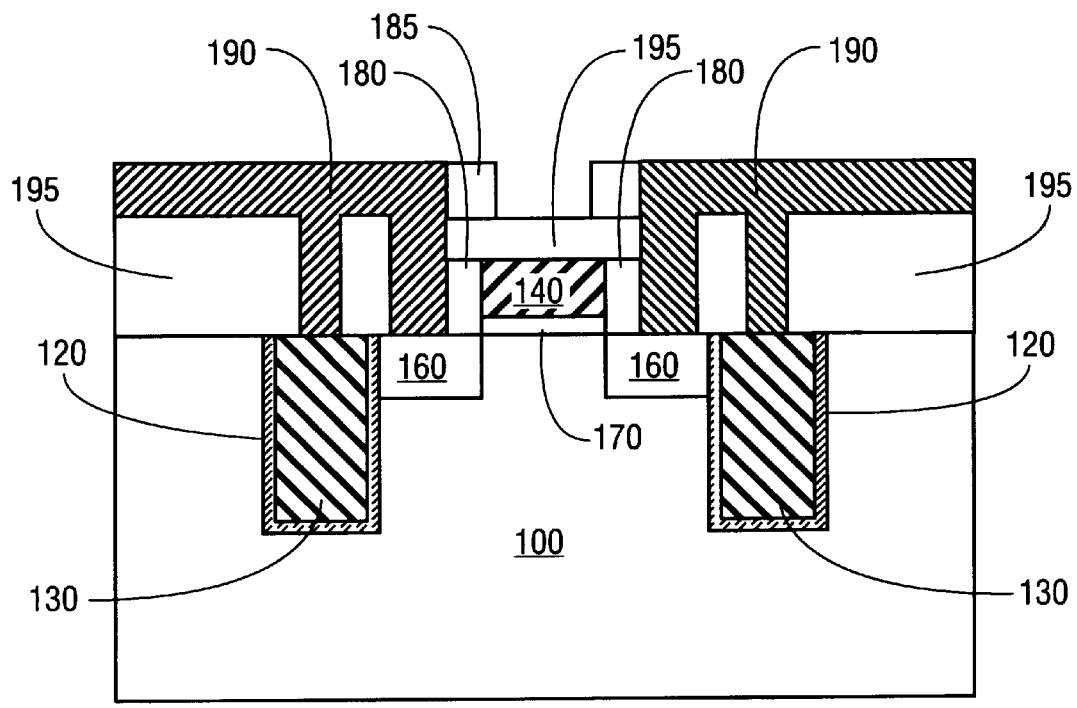
FIG. 10 is a schematic view of a portion of an integrated circuit structure showing dielectric sidewall spacers formed between opposing metal interconnect lines for an embodiment of the invention of an integrated circuit structure having an interlayer thermally conducting dielectric material in accordance with the invention.

The introduction of thermally conducting material between interconnect lines may be incorporated into the process described above with respect to FIGS. 1–6 and wherein the electrical interconnect 190 doubles as a thermal interconnect. FIG. 10 shows that, after interconnect line 190 patterning to diffusion regions 160 and thermally conducting material 130, a dielectric layer, for example, a conformal oxide, is deposited and sidewall spacers formed by a conventional anisotropic etching technique to form interface spacer portions 185 between adjacent electrical interconnect structures 190. For example, $SiO_2$ spacer portions 185 of between 500–1,000 Å may be formed.

Figure 11:
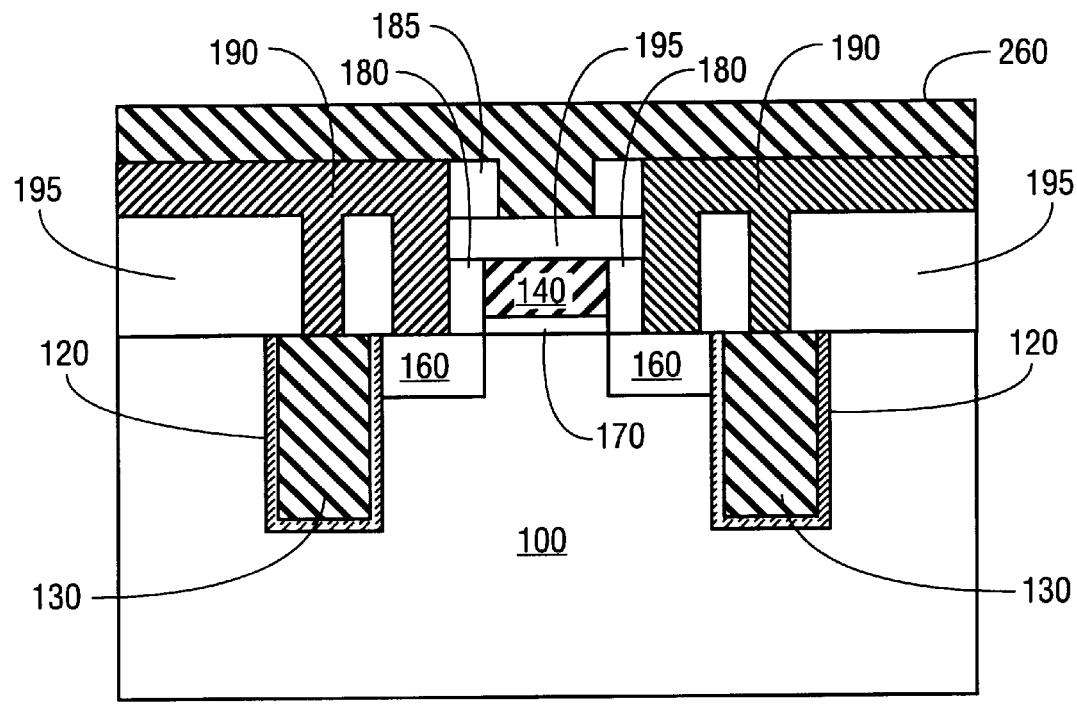
FIG. 11 is a schematic view of a portion of an integrated circuit structure showing a layer of thermally conducting dielectric material deposited over a first level metal interconnect system for an embodiment of the invention of an integrated circuit structure having an interlayer thermally conducting dielectric material in accordance with the invention.

FIG. 11 shows that once interface spacer portions 185 are formed, a thermally conducting material 260 is deposited over the structure in a similar manner as was done with respect to FIG. 3, supra. Further, in the case where interlayer thermally conducting material 260 is used in connection with a substrate with thermally conducting material-filled trenches, thermally conducting material 260 can be the same as thermally conducting material 130 filled in substrate trenches.

Figure 12:
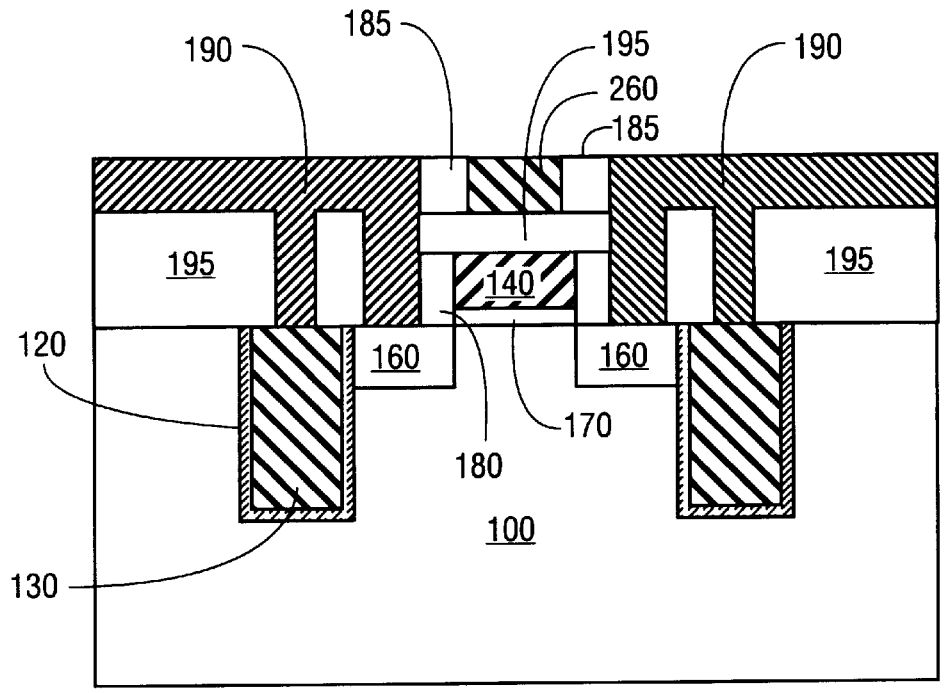
FIG. 12 is a schematic view of a portion of an integrated circuit structure showing a planarized thermally conducting dielectric material between opposing metal interconnect lines for an embodiment of the invention of an integrated circuit structure having an interlayer thermally conducting dielectric material in accordance with the invention.
Figure 13:
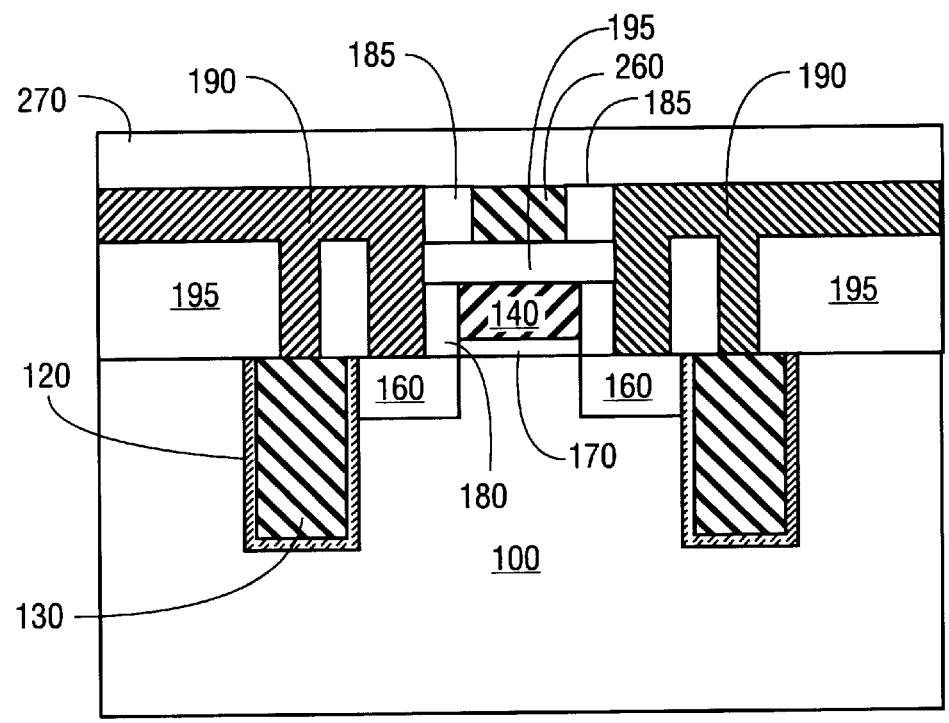
FIG. 13 is a schematic view of a portion of an integrated circuit structure showing an interlayer dielectric deposited over the structure to passivate the metal line and the thermally conducting dielectric material for an embodiment of the invention of an integrated circuit structure having an interlayer thermally conducting dielectric material in accordance with the invention.
Figure 14:
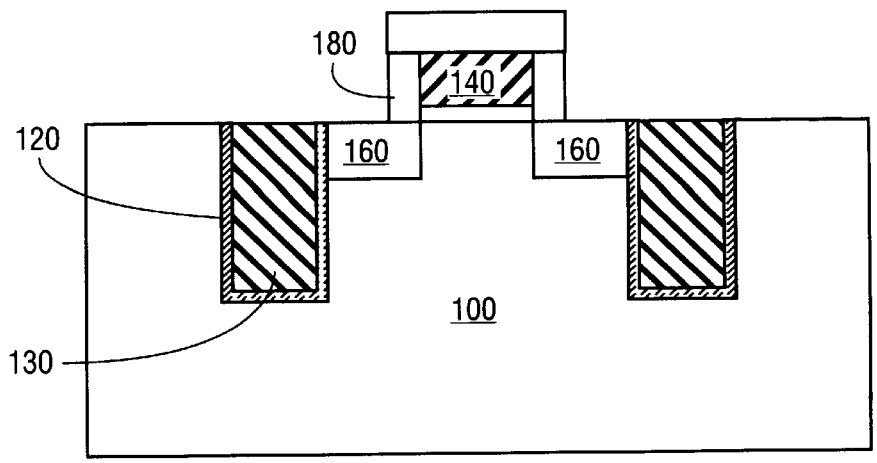
FIG. 14 is a schematic view of a portion of an integrated circuit structure showing an embodiment of the invention with a transistor device adjacent to a trench filled with thermally conducting dielectric material in accordance with the invention.
Figure 15:
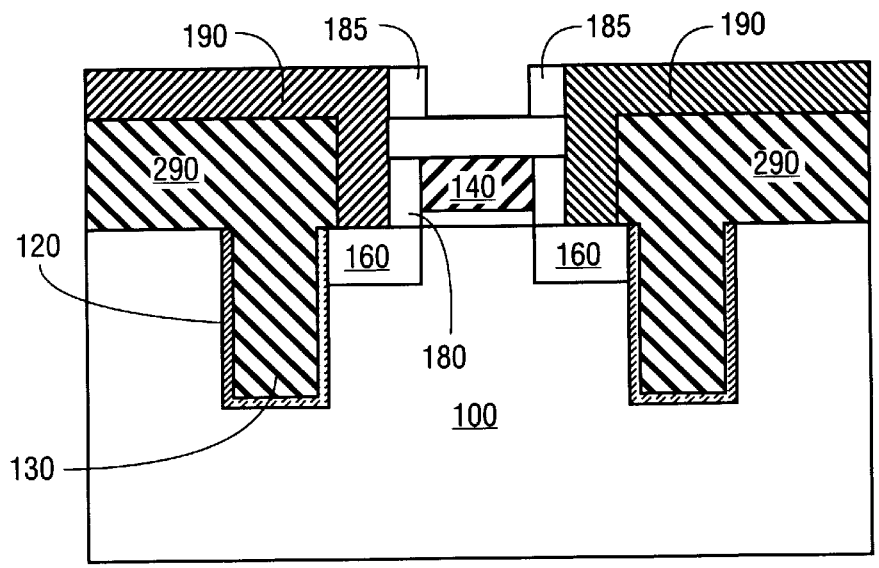
FIG. 15 is a schematic view of a portion of an integrated circuit structure showing an embodiment of the invention wherein thermally conducting dielectric material overlies the structure and metal contacts are established to the diffusion regions in accordance with the invention.
Figure 16:
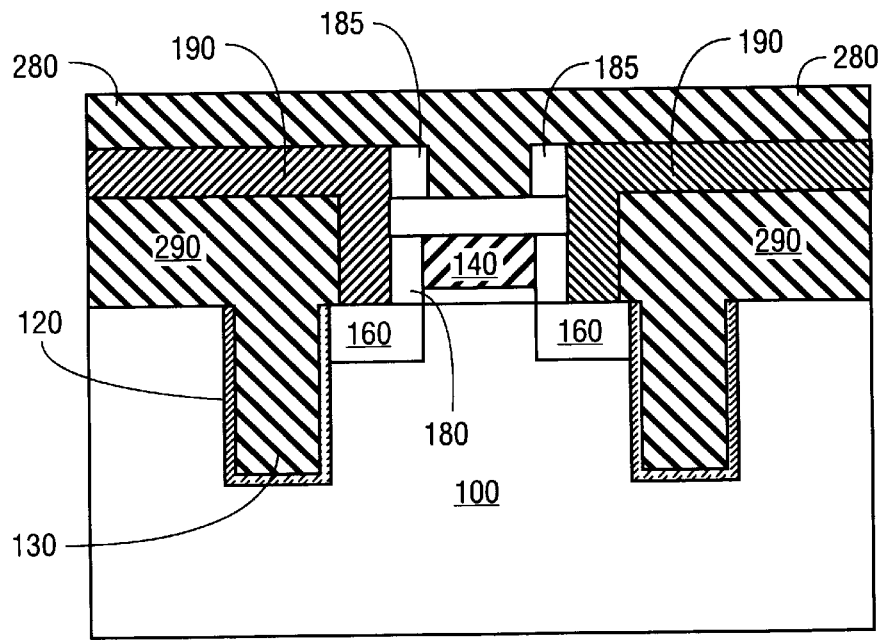
FIG. 16 is a schematic view of a portion of an integrated circuit structure showing an embodiment of the invention wherein the interlayer dielectric layer is replaced with thermally conducting dielectric material in accordance with the invention.

The deposition of thermally conducting material 260 is followed by a chemical-mechanical polish process to planarize the structure and polish thermally conducting material 260 back, using metal interconnect 190 for end point detection. An etching process may also be substituted for the chemical-mechanical polish process. In this manner, as shown in FIG. 12, thermally conducting material 260 remains in the region adjacent distinct electrical interconnect lines 190 forming a thermally conducting inter-metal trench 260 separated by dielectric sidewall spacer portions 185. A standard interlayer dielectric 270, for example a TEOS or PTEOS $SiO_2$, is then deposited over the structure as shown in FIG. 13. The same or similar process as described in FIGS. 10–13 may be repeated for higher level interconnects.

Where interconnect capacitance is of less concern, the interlayer dielectric may be completely replaced with thermally conducting dielectric material as shown in FIGS. 14–16 wherein thermally conducting material 280 and 290 that is also electrically insulating is deposited adjacent electrical interconnect system 190. This structure may be achieved by substituting the deposition of dielectric material that would otherwise isolate the patterned metal lines with the thermally conducting dielectric material described above with reference to other embodiments of the invention. FIG. 14, shows a schematic side view showing a transistor formed in an active region of a substrate and trenches filled with thermally conducting material 130 adjacent the transistor device and a spacer layer 180 around the gate. As shown in FIG. 15, thermally conducting dielectric layer 290 overlies the structure and metal interconnect lines 190 are patterned to diffusion regions 160. FIG. 15 also shows interconnect lines adjacent distinct electrical interconnect lines 190 isolated from one another by sidewall spacers 185. Finally, in FIG. 16, a layer of thermally conducting material 280 that is also electrically insulating overlies the structure.

By introducing a trench filled with thermally conducting material, the thermal dissipation of the chip may be significantly improved with little, if any, negative impact on performance and process. By extending the use of the thermally conducting material to inter-metal space, the embodiments in accordance with the invention further improve both heat dissipation and temperature uniformity across the chip.

Due to the use of thermally conductive material in accordance with the invention, thermal equilibrium across the chip can be achieved much faster than conventional structures to provide a temperature distribution across the chip that is more uniform. This results in a more reliable electromigration of the interconnect system. The thermally conducting material utilized in accordance with the invention also helps to dissipate heat from the transistor to the surface of the structure.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A semiconductor device, comprising:

a semiconductor substrate having a trench surrounding a cell region, wherein a portion of said trench contains an electrically insulating material having a thermal conductivity greater than 0.2 W/cmK;

a contact to said electrically insulating material and overlying a portion of said electrically insulating material; and a circuit device formed in the cell region.

2. The device of claim 1, further comprising a layer of dielectric material on the sidewalls of said trench.

3. The device of claim 2, wherein said electrically insulating material is selected from the group consisting of AlN, BN, SiC, polysilicon, and CVD diamond.

4. The device of claim 1, wherein said contact to said thermally conducting material is a first contact, the device further comprising a transistor structure in said cell region, said transistor structure including a gate on said substrate and diffusion regions in said substrate adjacent said gate, and a second contact to at least one of said gate and said diffusion regions to form an electrical interconnection.

5. The device of claim 4, wherein said first contact is integrated with said second contact.

6. The device of claim 4, wherein said thermally conducting material is a first thermally conducting material and said second contact has a surface, the device further comprising a layer of a second thermally conducting material overlying said cell region adjacent to said surface of said second contact.

7. An integrated circuit device, comprising:

a semiconductor substrate having a trench defining a cell region, wherein a portion of said trench comprises an electrically insulating material having a thermal conductivity greater than 0.2 W/cmK;

a first contact to said electrically insulating material in said trench to form a thermal interconnection; and a transistor structure in said cell region, said transistor structure including a gate on said substrate and diffusion regions in said substrate adjacent said gate, and a second contact having a surface, said second contact electrically coupled to at least one of said gate and said diffusion regions to form an electrical interconnection.

8. The device of claim 7, wherein said first contact is integrated with said second contact.

9. The device of claim 7, further comprising a layer of a second electrically insulating material overlying said cell region and adjacent a surface of said second contact.

10. The device of claim 8, further comprising:

a third contact having a surface, said third contact electrically coupled to said electrical interconnection; and a third electrically insulating material adjacent said surface of said third contact.

11. A semiconductor device, comprising:

a semiconductor substrate having a trench defining a cell region, wherein a portion of said trench contains a material having a thermal conductivity greater than the thermal conductivity of polysilicon; and a contact to said thermally conductive material.

12. The device of claim 11, further comprising a layer of dielectric material on the sidewalls of said trench.

* * * * *